US008929084B2

(12) United States Patent
Vogas et al.

(10) Patent No.: US 8,929,084 B2
(45) Date of Patent: Jan. 6, 2015

(54) MODULAR CORE ENGINE (CE) RADIO ARCHITECTURE

(75) Inventors: Michael S. Vogas, Morristown, NJ (US); Boris Radovcic, Rockaway, NJ (US); Todd R. DeLuck, Norwood, NJ (US); George M. Horihan, Staten Island, NY (US); Minh Le, Edison, NJ (US); Kenneth E. Kolodziej, Lexington, MA (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 393 days.

(21) Appl. No.: 13/466,990

(22) Filed: May 8, 2012

(65) Prior Publication Data

US 2012/0287585 A1 Nov. 15, 2012

Related U.S. Application Data

(60) Provisional application No. 61/483,964, filed on May 9, 2011.

(51) Int. Cl.
*H05K 1/14* (2006.01)

(52) U.S. Cl.
CPC ...... *H05K 1/144* (2013.01); *H05K 2201/10098* (2013.01); *H05K 2201/10189* (2013.01); *H05K 2201/09027* (2013.01)
USPC .......... 361/736; 361/730; 361/734; 361/735; 361/752; 361/753; 174/59; 174/60; 174/559; 174/563

(58) Field of Classification Search
CPC .................... H05K 1/144; H05K 2201/10189; H05K 2201/10098; H05K 2201/09027
USPC ......... 361/730, 734, 735, 736, 740, 752, 753, 361/759; 174/525, 541, 559, 563, 59, 60
See application file for complete search history.

(56) References Cited

U.S. PATENT DOCUMENTS 4,542,437 A * 9/1985 Ellis et al. ...................... 361/721
7,050,765 B2 * 5/2006 Ammar et al. ............... 455/90.3
7,184,272 B1 * 2/2007 Harlacher et al. ............ 361/729

* cited by examiner

*Primary Examiner* — Robert J Hoffberg
*Assistant Examiner* — Mukund G Patel
(74) *Attorney, Agent, or Firm* — Leo Zucker; Daniel J. Long

(57) ABSTRACT

A compact radio core engine (CE) module uniquely small in size and power consumption, in which only two circuit boards provide all the modem and transceiver functions needed for modern military radios. A modem circuit board has modem devices and a first connector mounted on the board, and a radio frequency (RF) circuit board has RF devices and a second connector mounted on the board. A module frame has an interior wall, and a side wall about the periphery of the interior wall. The modem and the RF circuit boards are positioned on opposite sides of the interior wall, and the connectors on the two boards mate with one another through an opening in the interior wall to exchange operating data and signals between the devices on the boards. The modem circuit board is seated entirely within a recess formed by the interior and the side walls of the frame.

11 Claims, 5 Drawing Sheets

MODULAR CORE ENGINE (CE) RADIO ARCHITECTURE

CROSS REFERENCE TO RELATED APPLICATION

The present application claims priority under 35 U.S.C. Section 119(e) of U.S. Provisional Patent Application No. 61/483,964 filed May 9, 2011, titled Modular Radio Component (Core Engine—CE) Architecture, and incorporated herein by reference in its entirety.

BACKGROUND OF THE INVENTION

1. Field of the Invention

The present invention relates to a modular communications radio architecture.

2. Discussion of the Known Art

Wideband radios are used, among other places, in the military where there is a continuing need to improve the size, weight, power, and cost (SWAP+C) of such radios. For example, in a so-called GMR/Cluster 1 radio architecture, there is a need to reduce the size of various circuit boards and their power consumption while maintaining the intended functionality of the boards.

In the above architecture, a radio core engine (CE) module is comprised of a circuit card assembly (CCA) including a digital modem circuit board measuring 9 by 6.5 inches. The modem board supports a 440GX Power PC processor with 1300 MIPS, 128 MBytes of DDR memory and 64 MB of Flash, and a 600 MHZ DSP with 64 MB of memory. The CCA also includes three additional circuit boards over which a number of electronic devices and components are arrayed in order to perform radio frequency (RF) transceiver functions of the core engine. Each one of the RF circuit boards also measures 9 by 6.5 inches. Notwithstanding, there is a need for a CE module that can be readily adapted to operate with a variety of existing and new wideband military radio communications platforms, many of which have only a limited amount of space within which to contain the module hardware.

SUMMARY OF THE INVENTION

According to the invention, a compact communications radio core engine (CE) module, includes a modem circuit board including modem devices and a first connector mounted on the board, and a radio frequency (RF) circuit board including RF devices and a second connector mounted on the board which is configured to mate with the first connector so that operating data and signals are exchanged between the devices on the two boards. A module frame is constructed and arranged to orient the modem and the RF circuit boards is such a manner that the second connector on the RF circuit board is aligned to mate with the first connector on the modem circuit card.

The module frame includes an interior wall having an opening that coincides with the first and the second connectors when the modem and the RF circuit boards are positioned on opposite sides of the wall, so that the connectors can mate with one another through the wall opening. A side wall extends about the periphery of the interior wall, so that the interior and the side walls form a first recess on a first side of the interior wall for receiving and seating the modem circuit card with the modem devices entirely within the first recess, and a second recess on a second side of the interior wall opposite the first side for receiving at least some of the RF devices when the RF circuit board is fixed on the module frame at the second side of the interior wall. A first end cover is dimensioned to fix the RF circuit board on the module frame when the first end cover is fastened to the side wall of the frame, and a second end cover is dimensioned to enclose the modem circuit board inside the module when the second end cover is fastened directly to the side wall of the frame.

For a better understanding of the invention, reference is made to the following description taken in conjunction with the accompanying drawing and the appended claims.

DETAILED DESCRIPTION OF THE INVENTION

The present invention relates to a compact radio core engine (CE) module having modem and RF circuit boards that are constructed and arranged so that the module can be adapted to a variety of military radio platforms including, for example, hand held, manpack, and vehicular platforms specified by the Joint Tactical Radio System (JTRS). Embodiments of the module are shown in FIGS. 1 to 6, and some of its advantages are noted below. It is contemplated that the module can obtain a reduction in cost of 75 percent.

Figure 1:
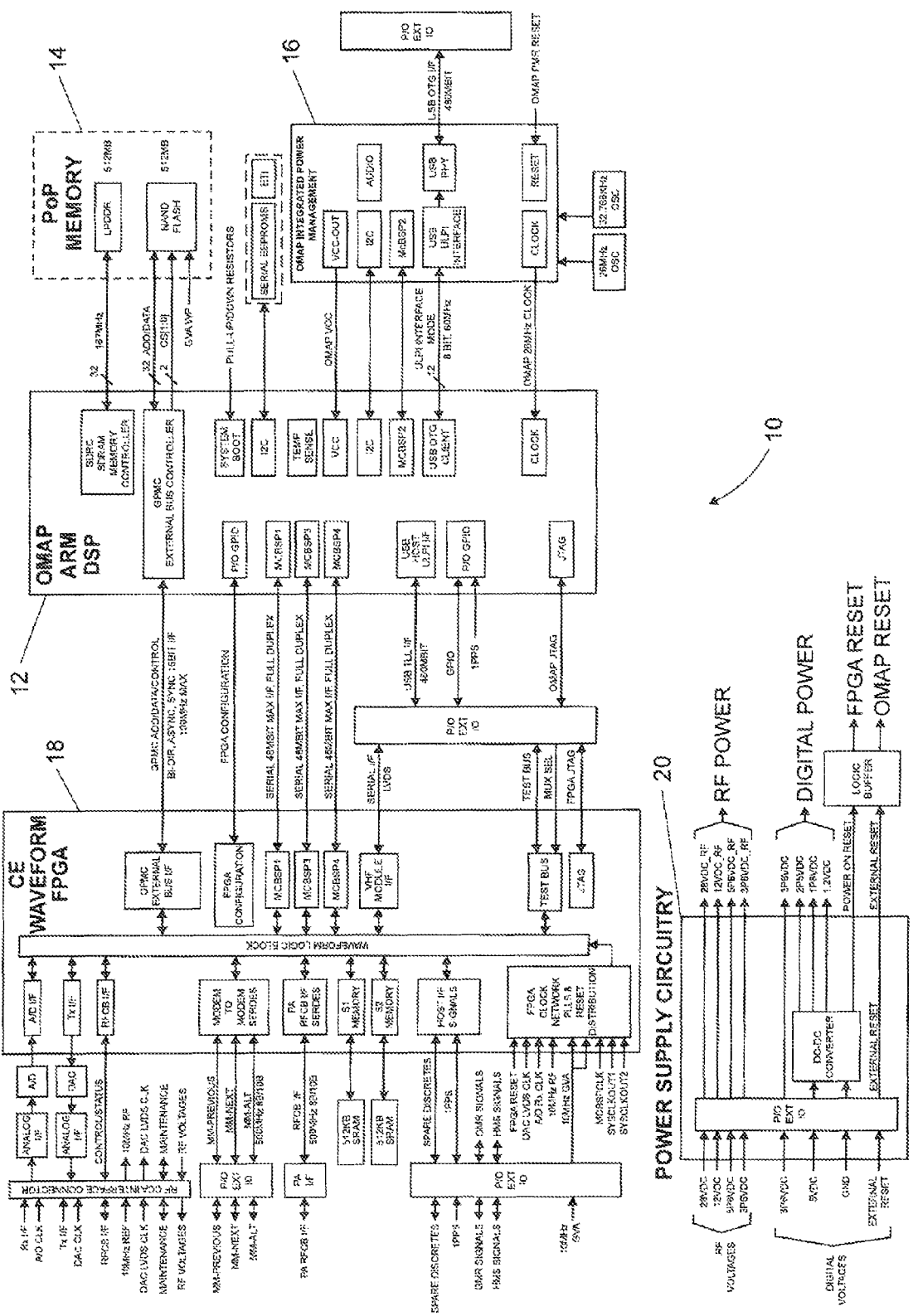
FIG. 1 is a block diagram of a modem board or card of a core engine (CE) module according to the invention.

FIG. 1 is a block diagram of a modem circuit card or board 10 of a core engine module according to the invention. The board 10 need measure only 3 by 2.75 inches, which is ⅙ the size of the prior modem board. The modem board 10 may also include, e.g., an OMAP ARM 3730 processor running at 1000 MHZ to provide 2000 MIPS, which is a 65 percent faster instruction rate than in the prior GMR/Cluster 1 architecture. The location of the OMAP processor 12 on the board 10 is shown at the lower left in FIG. 2.

The OMAP 12 includes a DSP that runs at 800 MHZ to obtain an overall increase of 60 percent compared to the prior architecture. An associated memory 14 within the OMAP ARM 3730 has a capacity of 512 Mbytes volatile DDR memory. Volatile memory in the prior architecture was limited to 128 Mbytes. The OMAP memory 14 also has a capacity of 512 Mbytes of non-volatile memory, whereas the prior architecture was limited to 64 Mbytes. Further, the OMAP 12 has an associated power management circuit chip 16 the location of which is also shown at the lower left in FIG. 2.

Figure 2:
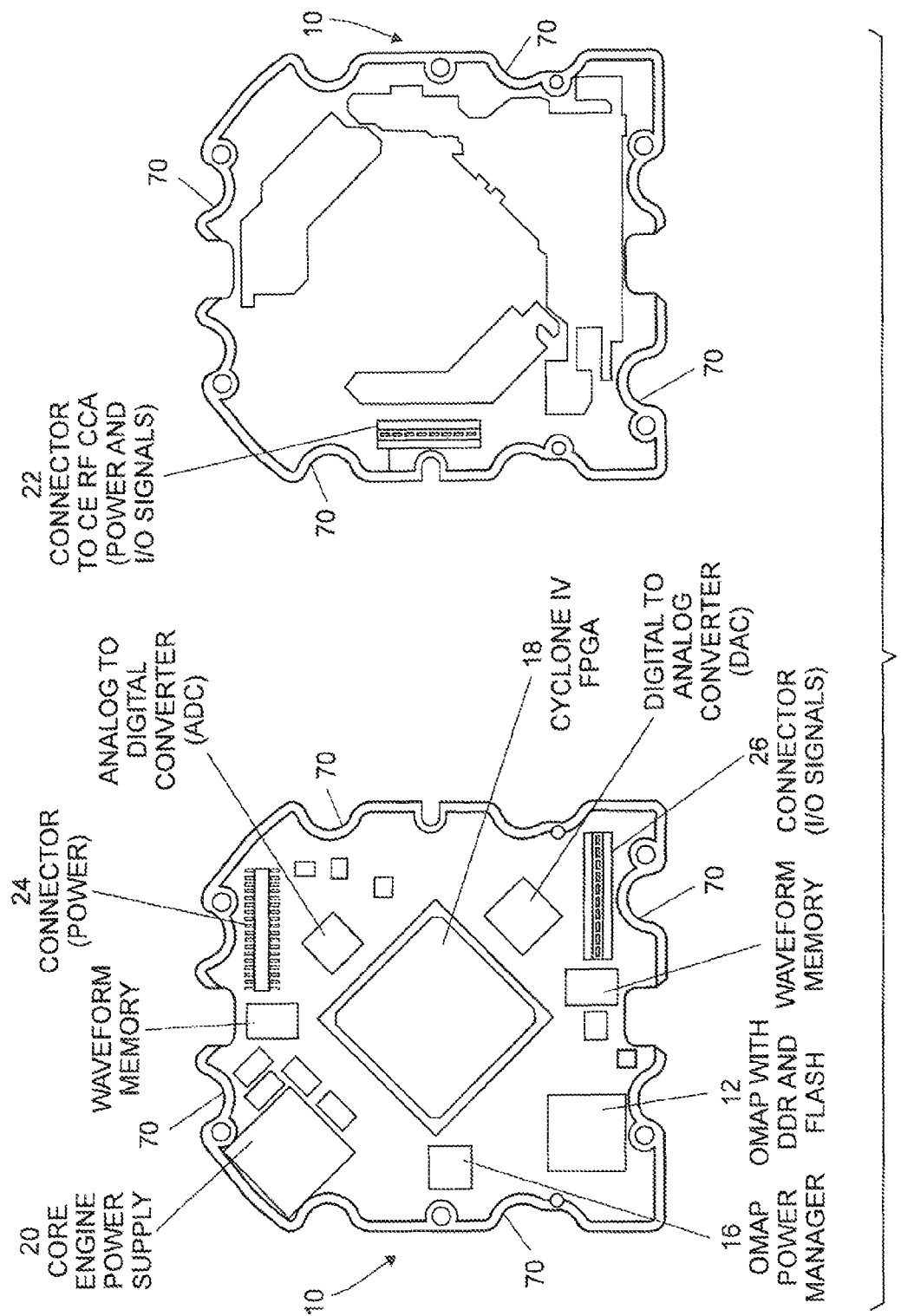
FIG. 2 shows plan views of both sides of the modem board of FIG. 1.

The modem board 10 also features, e.g., a Cyclone IV FPGA 18 that is centrally mounted on the board as seen at the left in FIG. 2, and an integrated core engine power supply 20 located on the board 10 at the upper left in FIG. 2. The power supply 20 provides 18 watts for operation of the inventive CE module, representing about a one-third reduction compared to 52 watts needed for the prior GMR/Cluster 1 architecture. Other modem board components are shown and labeled in FIG. 2.

A modem board-to-RF board connector 22 is mounted near a left side edge of the modem board 10, on a bottom surface of the board, as viewed at the right in FIG. 2. The connector 22 is located and configured to mate with a corresponding connector on a RF circuit board as detailed below, for enabling various operating data and signals to be exchanged between the modem and the RF circuit boards, and to supply power to the latter.

A power connector 24 and an I/O signal connector 26 are mounted near a top and a bottom edge of the modem board 10, on a top surface of the board, as viewed at the left in FIG. 2. The connectors 24, 26, enable a host platform to exchange operating data, signals, and power with the modem and the RF circuit boards of the inventive CE module.

Figure 3:
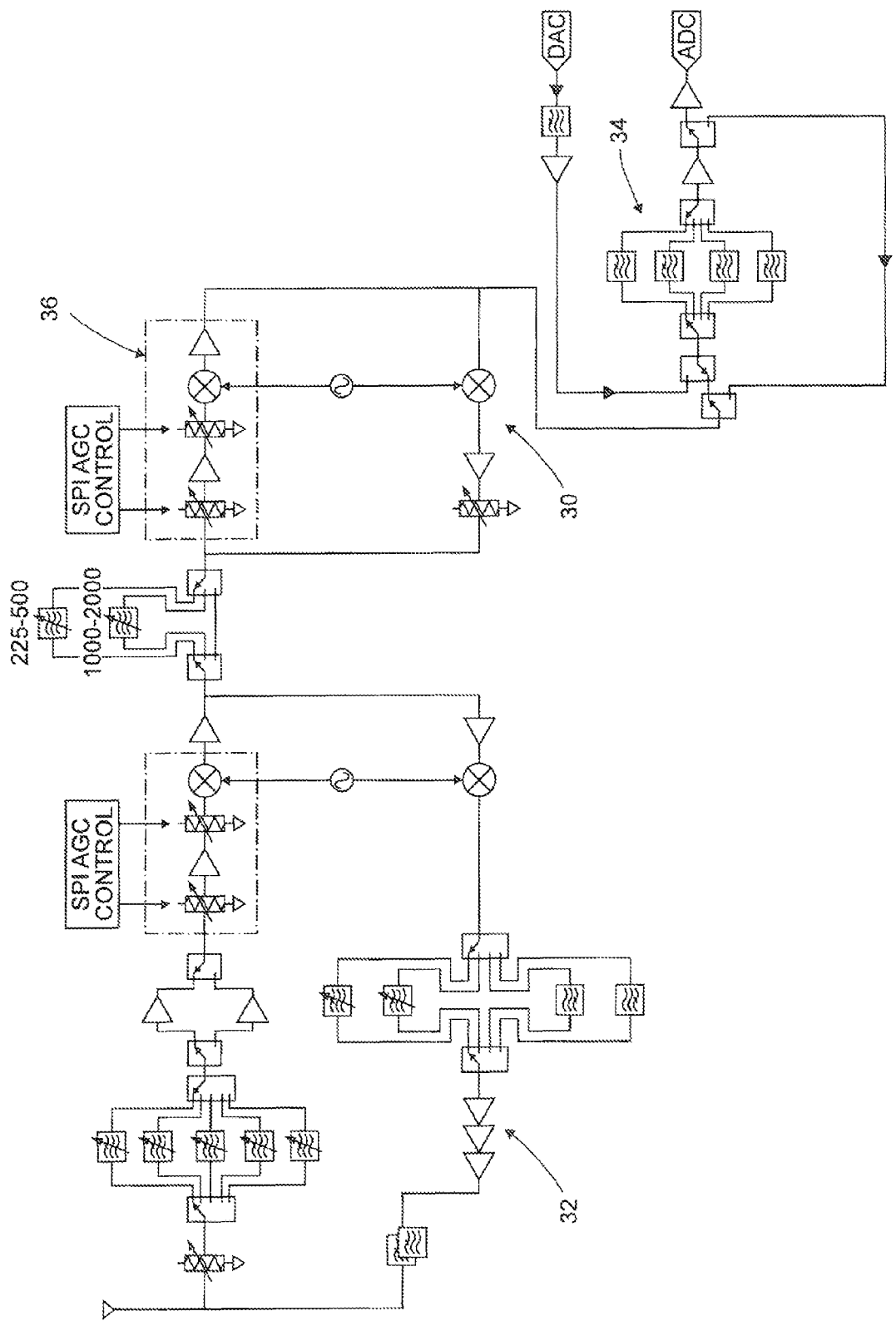
FIG. 3 is a schematic block diagram of a radio frequency (RF) transceiver board of the inventive CE module.

FIG. 3 is a representative schematic diagram of a RF circuit board 30 of the inventive CE module. The board 40 need only measure 3 by 3 inches, thus requiring only one-sixth the volume of the three larger RF circuit boards in the prior architecture. Radio frequency transmitter and receiver (transceiver) functions of the module are performed entirely by the devices supported on the one circuit board 30.

The board 30 may support a transmit power amplifier (PA) 32 with a five watt RF power output capability. By contrast, the prior architecture allowed only 100 mw of RF power out. Further, a bank of electronically switched filters 34 are provided at the output of a second IF stage. The location of the filter bank 34 is shown at the right in FIG. 4. Other components on both sides of the RF circuit board 30 are shown and labeled in FIG. 4.

A RF circuit board-to-modem board connector 40 is mounted near a right side edge of the RF board 30, on the surface of the board 30 shown at the right in FIG. 2. The connector 40 is located and configured to mate with the connector 22 on the modem board 10 when the two boards 10, 30, are assembled to form the inventive CE module 50 as shown in FIGS. 5 and 6.

Figure 5:
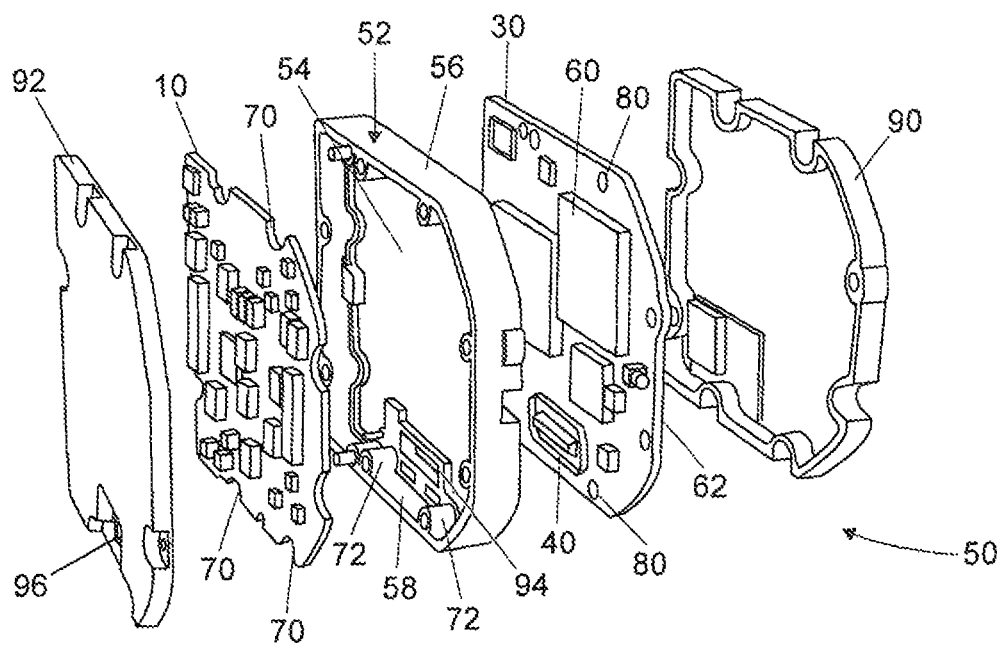
FIG. 5 illustrates an assembly of the modem and the transceiver boards within a module shell to form the CE module.
Figure 6:
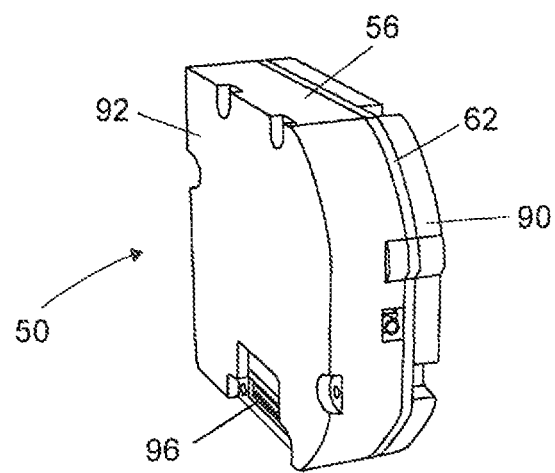
FIG. 6 illustrates the assembled CE module.

In FIG. 5, an aluminum or other electrically conductive material is machined, cast, or otherwise formed into a generally rectangular, D-shaped frame or shell 52. The shell 52 has an interior wall 54, and a side wall 56 is formed about the perimeter of the shell 52. The interior and the side walls 54, 56 define a first recess 58 at the left side of the wall 54 as viewed in FIG. 5, within which recess 58 the modem circuit board 10 in FIG. 2 can be received and seated. The shell walls 54, 56 also define a second recess at the right side of the wall within which portions of devices 60 on a facing side of the RF circuit board 30 are received when an outer edge 62 of the board 30 is flush with the right edge of the shell side wall 56 as shown in FIG. 6.

As seen in FIGS. 2 and 5, the modem board 10 has a number of cutouts 70 along its periphery. The cutouts 70 act to guide the board 10 over corresponding bosses 72 formed on the inner surface of the shell side wall 56 as the board 10 is received and seated within the first recess 58 of the shell 52.

Figure 4:
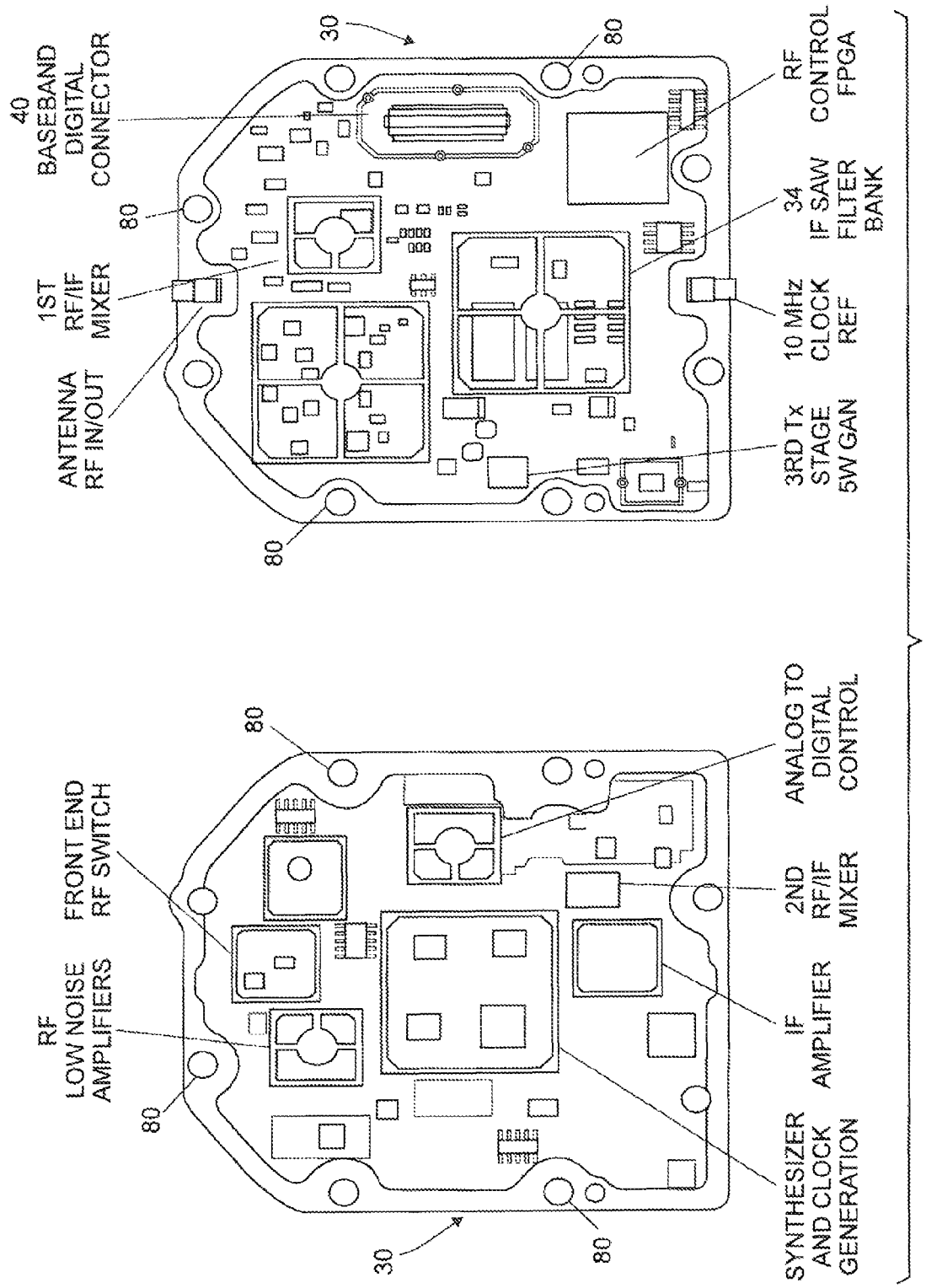
FIG. 4 shows plan views of both sides of the RF transceiver board of FIG. 3.

Further, as seen in FIGS. 4 and 5, the RF circuit board 30 has a number of fastener openings 80 formed along its perimeter. The openings 80 allow for passage of cover fasteners when the outer edge 62 of the board 30 is urged flush with the shell side wall 56 by a first shell end cover 90 as shown in FIG. 6. A second end cover 92 is fastened directly against the shell side wall 56 opposite the first cover 90, after the modem board 10 is seated within the shell recess 58.

An opening 94 is formed in the interior wall 54 of the shell 52 so as to coincide with the modem board-to-RF board connector 22 on the modem board 10, and with the RF circuit board-to-modem board connector 40 on the RF circuit board 30. Before the end covers 90, 92 are fastened to the shell 52, the two board connectors 22, 40 are engaged with one another through the wall opening 94. Once assembled, the module 50 may be operatively connected with an associated communications platform via the connectors 24, 26, on the modem board 10, access to which is provided via one or more openings 96 in the second end cover 92. Separate openings also may be formed for passage of antenna and other signal wires or cables.

It will be appreciated that multiple CE modules 50 may be combined to enable multichannel, multiple input-multiple output (MIMO), and adaptive antenna array radio capabilities. See commonly owned U.S. patent application Ser. No. 13/455,745 filed Apr. 25, 2012, titled Individually Phase Controlled RF Oscillators for Antenna Beam Steering, and incorporated herein by reference.

A separate personality module in a compatible form factor may also allow the inventive module to be adapted for use with different radio platforms. See commonly owned U.S. patent application Ser. No. 13/461,888 filed May 2, 2012, titled Modular Radio Communications Systems Architecture, and incorporated herein by reference.

The inventive CE module 50 is uniquely small in size and power consumption for the functions it performs, allowing it to be readily adapted in multiple radio platforms while providing all necessary components to perform the modem and transceiver functions required of modern software defined military radios.

While the foregoing represents preferred embodiments of the invention, it will be understood by those skilled in the art that various modifications, additions, and changes may be made without departing from the spirit and scope of the invention, and that the invention includes all such modifications and changes as come within the scope of the following claims.

We claim:

1. A communications radio core engine (CE) module, comprising:

a modem circuit board including modem devices and a first connector mounted on the board;

a radio frequency (RF) circuit board including RF devices for performing transmitter and receiver functions of the module and a second connector mounted on the board, and the second connector is configured to mate with the first connector on the modem circuit board so that operating data and signals are exchanged between the devices on the two boards; and a module frame constructed and arranged to position the modem and the RF circuit boards so that the second connector on the RF circuit board is aligned to mate with the first connector on the modem circuit board;

the module frame comprising:

an interior wall having a first opening that coincides with the first and the second connectors when the modem and the RF circuit boards are positioned on opposite sides of the wall, to enable the connectors to mate with one another through the first opening; and a side wall extending about the periphery of the interior wall, wherein the interior wall and the side wall form a first recess on a first side of the interior wall for receiving and seating the modem circuit card with the modem devices entirely within the first recess, and a second recess on a second side of the interior wall opposite the first side for receiving at least some of the RF devices when the RF circuit board is fixed on the module frame on the second side of the interior wall and the first and the second connectors on the boards mate with one another;

a first end cover dimensioned to fix the RF circuit board on the module frame when the first end cover is fastened to the side wall of the frame; and a second end cover dimensioned to enclose the modem circuit board inside the module when the second end cover is fastened directly to the side wall of the frame.

2. A CE module according to claim 1, wherein the modem circuit board measures 3 by 2.75 inches.

3. A CE module according to claim 1, wherein the RF circuit board measures 3 by 3 inches.

4. A CE module according to claim 1, wherein the modem circuit board includes a power supply.

5. A CE module according to claim 4, wherein the modem and the RF circuit boards are configured so that the power supply on the modem circuit board powers the RF devices on the RF circuit board when the first and the second connectors mate with one another.

6. A CE module according to claim 1, wherein the side wall of the frame has a number of bosses formed along an inside surface of the side wall facing the first recess in the frame, and the modem circuit board has a corresponding number of cutouts along the periphery of the board so that the cutouts serve to guide the board over the bosses when the board is received and seated within the first recess.

7. A CE module according to claim 1, wherein the RF circuit board has a number of fastener openings formed along a peripheral edge of the board for passage of corresponding fasteners for the first end cover, so that the peripheral edge of the RF circuit board is urged flush with a confronting edge of the side wall of the frame when the first end cover is fastened to the side wall of the frame.

8. A CE module according to claim 1, wherein the second end cover has an opening for providing access to communication platform connectors mounted on the modem circuit board.

9. A CE module according to claim 1, wherein the modem devices include a waveform FPGA, and an OMAP processor with associated volatile and non-volatile memory capacities of 512 Mbytes each.

10. A CE module according to claim 1, wherein the RF devices include a five watt transmit power amplifier.

11. A CE module according to claim 1, wherein the RF devices include a bank of electronically switched filters.

* * * * *